(12) United States Patent
Furuta et al.

(10) Patent No.: US 10,641,256 B2
(45) Date of Patent: May 5, 2020

(54) VACUUM PUMP WITH ABATEMENT FUNCTION

(71) Applicant: EBARA CORPORATION, Tokyo (JP)

(72) Inventors: Hiroki Furuta, Tokyo (JP); Koichi Iwasaki, Tokyo (JP); Keiichi Ishikawa, Tokyo (JP); Tetsuo Komai, Tokyo (JP); Shinichi Sekiguchi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 243 days.

(21) Appl. No.: 14/656,652

(22) Filed: Mar. 12, 2015

(65) Prior Publication Data

US 2015/0260174 A1   Sep. 17, 2015

(30) Foreign Application Priority Data

Mar. 17, 2014  (JP) .................................. 2014-054127
Dec. 18, 2014  (JP) .................................. 2014-256365

(51) Int. Cl.
*F04B 23/04* (2006.01)
*B01D 53/86* (2006.01)
(Continued)

(52) U.S. Cl.
CPC ............ *F04B 23/04* (2013.01); *B01D 53/005* (2013.01); *B01D 53/323* (2013.01);
(Continued)

(58) Field of Classification Search
CPC .......... B01D 2251/30; B01D 2252/103; B01D 2253/102; B01D 2253/108;
(Continued)

(56) References Cited

U.S. PATENT DOCUMENTS 5,131,825 A     7/1992  Bachmann et al.
7,578,883 B1 *  8/2009  Williams ............... B01D 53/38
                                             118/715
(Continued)

FOREIGN PATENT DOCUMENTS

EP     0821995 A1    2/1998
EP     2324902 A1    5/2011
(Continued)

OTHER PUBLICATIONS

European Patent Application No. 15000768.0; Extended Search Report; dated Sep. 23, 2015; 7 pages.

*Primary Examiner* — Patrick Hamo
*Assistant Examiner* — Chirag Jariwala
(74) *Attorney, Agent, or Firm* — BakerHostetler

(57) ABSTRACT

A vacuum pump with abatement function which can prevent contamination of a process chamber without allowing products generated by exhaust gas treatment to flow back to the process chamber, and can reduce the amount of gas to be treated without allowing a purge gas and a diluent gas to be contained in an exhaust gas, and thus can achieve energy saving by reducing the amount of energy required for the exhaust gas treatment in an abatement part is disclosed. The vacuum pump with abatement function includes a vacuum pump to which at least one abatement part for treating an exhaust gas is attached. The vacuum pump comprises a dry vacuum pump having a main pump capable of evacuating gas from an atmospheric pressure and a booster pump for increasing an evacuation speed of the main pump, and the at least one abatement part for treating the exhaust gas is connected between the main pump and the booster pump.

9 Claims, 11 Drawing Sheets

(51) Int. Cl.
  *F04D 17/16* (2006.01)
  *C23C 16/44* (2006.01)
  *B01D 53/00* (2006.01)
  *B01D 53/32* (2006.01)
  *F04D 19/04* (2006.01)

(52) U.S. Cl.
  CPC ..... *B01D 53/8659* (2013.01); *B01D 53/8662* (2013.01); *C23C 16/4412* (2013.01); *F04D 17/168* (2013.01); *F04D 19/04* (2013.01); *B01D 2257/2025* (2013.01); *B01D 2257/2027* (2013.01); *B01D 2257/2045* (2013.01); *B01D 2257/2047* (2013.01); *B01D 2257/2064* (2013.01); *B01D 2257/2066* (2013.01); *B01D 2257/553* (2013.01); *B01D 2258/0216* (2013.01); *F05D 2260/607* (2013.01); *Y02C 20/30* (2013.01); *Y02P 70/605* (2015.11)

(58) Field of Classification Search
  CPC ...... B01D 2253/1124; B01D 2253/206; B01D 2255/10; B01D 2257/2025; B01D 2257/204; B01D 2257/2042; B01D 2257/2045; B01D 2257/553; B01D 2257/556; B01D 2258/0216; B01D 2259/818; B01D 53/0438; B01D 53/685; B01D 53/70; B01D 53/8659; B01D 53/8662; B01D 53/005; B01D 53/323; B01D 53/26; B01D 53/32; B01D 53/86; B01D 2257/2027; B01D 2257/2047; B01D 2257/2064; B01D 2257/2066; B01D 2257/533; F04B 37/06; F04B 37/14; F04B 15/04; F04B 17/03; F04B 23/04; F04B 39/00; F04B 49/02; F04B 49/24; F04C 25/02; F04C 29/00; F04D 17/168; F04D 19/04; F05D 2260/607; F23G 7/06; Y02P 70/605; Y02C 20/30
  USPC ............... 422/168–183; 417/423.4
  See application file for complete search history.

(56) References Cited

U.S. PATENT DOCUMENTS

| | | | | |
|---|---|---|---|---|
| 8,382,909 | B2* | 2/2013 | Aitchison | C23C 16/4412 134/18 |
| 2003/0007910 | A1 | 1/2003 | Diamant et al. | |
| 2004/0081565 | A1* | 4/2004 | Kuramoto | F01C 21/007 417/360 |
| 2004/0229419 | A1* | 11/2004 | Namose | B01D 53/70 438/202 |
| 2005/0142000 | A1* | 6/2005 | Maquin | B01D 53/38 417/207 |
| 2005/0147509 | A1* | 7/2005 | Bailey | F04D 19/04 417/423.4 |
| 2006/0130649 | A1* | 6/2006 | Jain | B01D 53/025 95/82 |
| 2007/0020115 | A1* | 1/2007 | Huntley | F04D 19/046 417/199.1 |
| 2007/0160512 | A1* | 7/2007 | Ohmi | B01J 19/088 422/186.03 |
| 2009/0056552 | A1 | 3/2009 | Ono et al. | |
| 2013/0171919 | A1* | 7/2013 | Shinohara | B01D 53/005 454/49 |
| 2013/0280062 | A1* | 10/2013 | Suzuki | F01C 21/10 415/213.1 |
| 2014/0039655 | A1* | 2/2014 | Shelley | G05B 19/41865 700/95 |
| 2014/0294609 | A1* | 10/2014 | Palisson | B01D 53/323 417/68 |
| 2015/0114476 | A1* | 4/2015 | Turner | F04C 23/005 137/2 |

FOREIGN PATENT DOCUMENTS

| | | |
|---|---|---|
| FR | 2864913 A1 | 7/2005 |
| GB | 2500610 A | 10/2013 |
| JP | 04-290525 | 10/1992 |
| JP | H06-047269 A | 2/1994 |
| JP | 06-226032 | 8/1994 |
| JP | 09-000861 | 1/1997 |
| JP | 10-150044 A | 6/1998 |
| JP | H10-331624 A | 12/1998 |
| JP | H11-271809 A | 10/1999 |
| JP | 2000-317265 A | 11/2000 |
| JP | 2001-176762 A | 6/2001 |
| JP | 2004-237162 A | 8/2004 |
| JP | 2005-109383 A | 4/2005 |
| JP | 2007-069201 A | 3/2007 |
| JP | 2010-234334 A | 10/2010 |
| JP | 2012-057192 A | 3/2012 |

* cited by examiner

VACUUM PUMP WITH ABATEMENT FUNCTION

CROSS REFERENCE TO RELATED APPLICATIONS

This document claims priorities to Japanese Patent Application Number 2014-054127 filed Mar. 17, 2014 and Japanese Patent Application Number 2014-256365 filed Dec. 18, 2014, the entire contents of which are hereby incorporated by reference.

BACKGROUND

In a manufacturing process for manufacturing semiconductor devices, liquid crystal panels, LEDs, solar cells or the like, a process gas is introduced into a process chamber which is being evacuated to perform various processes such as an etching process or a CVD process. The process chamber for performing various processes such as an etching process or a CVD process is evacuated by a vacuum pump. Further, the process chamber and exhaust apparatuses connected to the process chamber are cleaned periodically by supplying a cleaning gas thereto. Because exhaust gases such as the process gas and the cleaning gas contain a silane-based gas ($SiH_4$, TEOS or the like), a halogen-based gas ($ClF_3$, HF, $F_2$, HCl, $Cl_2$ or the like), a PFC gas ($CF_4$, $C_2F_6$, $NF_3$, $SF_6$ or the like) or the like, such exhaust gases have negative effects on human bodies and on the global environment such as global warming. Therefore, it is not preferable that these exhaust gases are emitted to the atmosphere as they are.

Accordingly, these exhaust gases discharged from the process chamber are treated to be made harmless by an exhaust gas treatment apparatus, and the harmless exhaust gases are emitted to the atmosphere. In this case, exhaust systems equipped with the exhaust gas treatment apparatus are classified broadly into a system in which the exhaust gas treatment apparatus is arranged at an immediately downstream side of the process chamber and the vacuum pump is arranged at a downstream side of the exhaust gas treatment apparatus, i.e., a system in which the process chamber, the exhaust gas treatment apparatus, and the vacuum pump are arranged in this order; and a system in which the vacuum pump is arranged at an immediately downstream side of the process chamber and the exhaust gas treatment apparatus is arranged at a downstream side of the vacuum pump, i.e., a system in which the process chamber, the vacuum pump, and the exhaust gas treatment apparatus are arranged in this order. In the vacuum pump, a single vacuum pump may constitute an exhaust system, or a booster pump and a main pump may be connected to constitute an exhaust system.

The above system in which the process chamber, the exhaust gas treatment apparatus, and the vacuum pump are arranged in this order has the following problems: When operation of the exhaust gas treatment apparatus is stopped due to its breakdown or the like, or the operation of the exhaust gas treatment apparatus is stopped even in its normal operation state, products generated by exhaust gas treatment flow back to the process chamber to contaminate the process chamber.

On the other hand, the system in which the process chamber, the vacuum pump, and the exhaust gas treatment apparatus are arranged in this order has no problem that products generated by exhaust gas treatment flow back to the process chamber to contaminate the process chamber, because the vacuum pump is arranged between the process chamber and the exhaust gas treatment apparatus. Therefore, this system is widely used as a stable exhaust system.

However, the above system in which the process chamber, the vacuum pump, and the exhaust gas treatment apparatus are arranged in this order has the following problems: Since a purge gas and a diluent gas are introduced at an upstream side of the exhaust gas treatment apparatus, the exhaust gas treatment apparatus is required to treat the exhaust gas containing the purge gas and the diluent gas, and thus the amount of gas to be treated becomes large and the amount of energy inputted for exhaust gas treatment becomes large.

Conventional exhaust gas treatment apparatuses, including the above two systems, have the following problems.

1) The exhaust gas treatment apparatus is large in size and needs to be installed fixedly in a factory. Since it is difficult and costly to transport the exhaust gas treatment apparatus that has been installed fixedly, the exhaust gas treatment apparatus has been designed so that maintenance can be performed on site. On the other hand, in order to realize on-site maintenance, component parts such as a motor and a controller are designed to be detachable, and thus the exhaust gas treatment apparatus as a whole becomes expensive and large in size.

2) Since the exhaust gas treatment apparatus is installed fixedly and difficult to be replaced, at the time of breakdown of the apparatus, the process has been forced to be shut down until the completion of repair of the apparatus.

3) Since the exhaust gas treatment apparatus has been designed in accordance with the kind and flow rate of inflow gas, a large amount of work of design, manufacturing, and evaluation has been required.

4) Although the exhaust gas treatment apparatus has a function to treat the introduced gas, such exhaust gas treatment apparatus has not been designed to grasp connection status with another exhaust gas treatment apparatus. Therefore, in order to construct back-up, an additional control apparatus for collectively controlling, a plurality of exhaust gas treatment apparatuses has been needed.

5) Since the vacuum pump and the exhaust gas treatment apparatus are independent apparatuses and have respective controllers, operational manipulation, daily maintenance, analysis of histories at the time of trouble, and the like of them have been conducted individually, thus requiring troublesome and time-consuming work.

6) In order to avoid deposition of products in the pipe caused by cooling of the gas to be exhausted, the pipe interconnecting the vacuum pump and the exhaust gas treatment apparatus has been heated by using a heater. Thus, initial cost and running cost for the heater have been required.

7) In order to avoid deposition of products, in the connecting portion between the booster pump and the main pump, caused by cooling of the gas to be exhausted, the connecting portion has been heated by a heater or has been covered with a thermal insulator.

8) In order to avoid deposition of products, in the interior of the booster pump, caused by cooling of the gas to be exhausted, the booster pump has been heated by a heater or has been covered with a thermal insulator.

SUMMARY OF THE INVENTION

According to an embodiment, there is provided a vacuum pump with abatement function which can prevent contamination of a process chamber without allowing products generated by exhaust gas treatment to flow back to the process chamber, and can reduce the amount of gas to be treated without allowing a purge gas and a diluent gas to be contained in an exhaust gas, and thus can achieve energy saving by reducing the amount of energy required for the exhaust gas treatment in an abatement part.

Embodiments, which will be described below, relate to a vacuum pump for use in an exhaust system of a manufacturing apparatus for manufacturing semiconductor devices, liquid crystal panels, LEDs, solar cells, or the like, and more particularly to a vacuum pump with abatement function which comprises a vacuum pump, for evacuating a chamber of the manufacturing apparatus, to which an abatement function for treating an exhaust gas discharged from the chamber is added.

In an embodiment, there is provided a vacuum pump with abatement function comprising: a vacuum pump to which at least one abatement part for treating an exhaust gas is attached; wherein the vacuum pump comprises a dry vacuum pump having a main pump capable of evacuating gas from an atmospheric pressure and a booster pump for increasing an evacuation speed of the main pump; and the at least one abatement part for treating the exhaust gas is connected between the main pump and the booster pump.

The vacuum pump with abatement function according to the above-described embodiment comprises a dry vacuum pump, comprising a main pump and a booster pump, to which the abatement part for treating an exhaust gas to make the exhaust gas harmless is attached. In the above embodiment, "treating an exhaust gas to make the exhaust gas harmless" means to perform treatment for reducing a concentration of harmful substances in the exhaust gas. According to the vacuum pump with abatement function of the embodiment, since the booster pump is provided between a process chamber of a manufacturing apparatus and the abatement part, products generated by exhaust gas treatment do not flow back to the process chamber to contaminate the process chamber. Further, the amount of gas to be treated can be reduced because a purge gas and a diluent gas are not contained in the exhaust gas, and thus the amount of energy required for gas treatment in the abatement part can be reduced to achieve energy saving.

In an embodiment, plural kinds of the abatement parts employing different treatment types of exhaust gas are prepared. Further, a plurality of abatement parts having different treatment amounts of exhaust gas in each of the abatement parts employing different treatment types are prepared. Furthermore, a plurality of abatement parts having different treatment performances of exhaust gas in each of the abatement parts employing different treatment types are prepared. In an embodiment, at least one optimal abatement part is selected, depending on the amount and kind of the exhaust gas discharged from the chamber, from the plural kinds of abatement parts employing different treatment types, and/or the plural abatement parts having different treatment amounts of exhaust gas, and/or the plural abatement parts having different treatment performances of exhaust gas, and the selected abatement part is connected between the main pump and the booster pump.

In an embodiment, the abatement part comprises a plasma-type abatement part, a dry-type abatement part, a catalytic-type abatement part, or a heater-type abatement part.

Since the abatement part is provided between the main pump and the booster pump, the abatement part is required to perform abatement treatment of an exhaust gas under vacuum. Therefore, treatment types of exhaust gas employed in the abatement part include a plasma-type, a heater-type, a dry-type, and a catalytic-type.

In an embodiment, the abatement part connected between the main pump and the booster pump comprises a plurality of abatement parts which are arranged in series and/or in parallel.

According to the above-described embodiment, the plural abatement parts are arranged in series and/or in parallel to form a group of abatement parts which can cope with various kinds of process demands and complex process demands. The plural abatement parts may be connected in combination of the plural kinds of the abatement parts such as a plasma-type abatement part, a dry-type abatement part, a catalytic-type abatement part, and a heater-type abatement part, or in combination of the plural abatement parts of a single kind, depending on the amount and kinds of the exhaust gas.

In an embodiment, the plurality of the abatement parts are arranged in parallel to have back-up function of the abatement part.

According to the above-described embodiment, by arranging the plurality of abatement parts in parallel, back-up operation can easily be performed. Specifically, at the time of breakdown or maintenance of one abatement part, another abatement part can perform the back-up operation to make the process downtime zero. Since the abatement part is small in size and inexpensive, by installing a plurality of abatement parts for a single process chamber, the back-up function can be provided in a simple way at a low cost. The back-up function may be provided by connecting the same type of abatement parts in parallel, or by connecting the different types of abatement parts in parallel.

In an embodiment, the plurality of abatement parts comprise abatement parts having different treatment types of exhaust gas and/or different treatment amounts of exhaust gas and/or different treatment performances of exhaust gas.

In an embodiment, a controller configured to collectively control the vacuum pump and the abatement part is provided in the vacuum pump.

According to the above-described embodiment, the controller is configured to collectively control the vacuum pump comprising the main pump and the booster pump, and the abatement part so that a portion of signal input/output of the pump is connected to the abatement part, and operation control and status monitoring of the abatement part are performed by the controller. Specifically, the controller is configured to output operation/shutdown signals to the abatement part, and the abatement part is configured to output the status signals of the abatement part to the controller. Since the controller has a display capable of collectively displaying statuses of the dry vacuum pump and the abatement part, a communication port capable of collectively monitoring and/or operating the statuses, and a contact input/output port, connection points are reduced, and thus the operability is improved and the time required for setting up an apparatus can be shortened.

In an embodiment, the vacuum pump comprises a single main pump or a plurality of main pumps connected in parallel.

In an embodiment, the vacuum pump comprises a single booster pump or a plurality of booster pumps connected in series and/or in parallel.

In an embodiment, the vacuum pump comprises a gas passage for bypassing the abatement part, so that the abatement part is bypassed to allow only pump function to be used when treatment for making the gas harmless is not required.

According to the above-described embodiment, when treatment for making the exhaust gas harmless is not necessary, the abatement part is bypassed and the operation of the abatement part is stopped to allow only pump function to be used. Thus, energy saving can be achieved.

In an embodiment, an output power of an inverter used for driving the booster pump is monitored, and an operational state of the abatement part is changed based on a value of the output power.

The dry vacuum pump is driven by controlling a motor with an inverter. The inverter controls the motor at a rated rotational speed. An output power of the inverter is automatically controlled base on a motor load. Specifically, when the motor load increases, the output power of the inverter is automatically increased to keep an operational rotational speed. On the other hand, as a characteristic of the dry vacuum pump, as the gas flow rate to be sucked increases, the motor load is increased. Although the relationship between the amount of gas and the motor load differs depending on structures of pumps, the motor load varies in accordance with the amount of gas to be sucked in any event. If the relationship between the amount of gas to be sucked, the motor load, and the output power of the inverter is clarified in advance, the amount of gas to be sucked can be estimated from the output power of the inverter for driving the booster pump. Since the abatement function is not necessary when gas is not sucked, it is estimated whether or not gas flows, and when the gas does not flow, the operation of the abatement part is automatically stopped. Thus, energy saving can be achieved. Further, multilevel settings (e.g., high, medium, low) for the operation intensity of the abatement part are established in accordance with the amount of gas to be sucked which is estimated from the output power of the inverter for driving the booster pump, and when the amount of gas to be sucked is small according to the monitored output power of the inverter, the abatement part is operated at low intensity, thereby achieving energy saving.

Although the amount of gas to be sucked is estimated from the output power of the inverter used for driving the booster pump in the above embodiment, the amount of gas to be sucked may be estimated from the following methods.
1) The amount of gas to be sucked is estimated from the output power of the inverter used for driving the main pump. In the case where the amount of gas to be sucked is estimated either one of the main pump and the booster pump, there is no difference in their response speeds. However, because it is considered that estimation of the amount of gas is easier in the pump whose change of the output power depending on the amount of gas appears prominently than in the other pump, the pump whose change of the output power appears prominently is selected for the estimation of the amount of gas.
2) The amount of gas to be sucked is estimated from both of the output power of the inverter used for driving the booster pump and the output power of the inverter used for driving the main pump. In this case, taking into consideration the possibility that the pump whose estimated amount of gas to be sucked is larger between the main pump and the booster pump has a large load due to factors such as products except for the amount of gas, the abatement part is controlled according to the pump whose estimated amount of gas to be sucked is smaller, thereby enhancing energy conservation.

In an embodiment, the main pump and/or the booster pump, and the abatement part are in contact with each other, or are integrated.

According to the above-described embodiment, the main pump and the abatement part are arranged in contact with each other, and the booster pump and the abatement part are arranged in contact with each other. Here, "in contact with each other" means that a casing of the main pump and a casing of the abatement part are in contact with each other, and a casing of the booster pump and a casing of the abatement part are in contact with each other. In this case, a medium having high thermal conductivity such as silicone grease may be applied to a contact surface. Alternatively, a boundary part between the main pump and the abatement part may be constructed of a single common wall and a boundary part between the booster pump and the abatement part may be constructed of a single common wall to thereby integrate the main pump, the booster pump, and the abatement part.

In an embodiment, the vacuum pump comprises an enclosure configured to house the abatement part, and an exhaust part configured to connect the enclosure to an exhaust duct.

According to the above-described embodiment, since the abatement part is enclosed by the enclosure, and the enclosure is connected to the exhaust duct of a facility where the vacuum pump is installed, a negative pressure is kept in the enclosure itself. Thus, even if a leakage occurs in the abatement part by any chance, a harmful gas can be prevented from flowing out to the outside.

The above-described embodiments offer the following advantages.
1) Since a booster pump is provided between a process chamber of a manufacturing apparatus and an abatement part, products generated by exhaust gas treatment do not flow back to the process chamber to contaminate the process chamber.
2) The amount of gas to be treated can be reduced because a purge gas and a diluent gas are not contained in the exhaust gas, and thus the amount of energy required for gas treatment in the abatement part can be reduced to achieve energy saving.
3) By combining a dry vacuum pump and a small-sized exhaust gas treatment apparatus, the whole apparatus can be moved easily at the time of maintenance.
4) In case of breakdown, the broken-down pump (with exhaust gas treatment function) is replaced with a back-up pump (with exhaust gas treatment function), and the pump that has been repaired is returned to its original place, and thus the time of process shutdown can be minimized.
5) Since modularized abatement parts are combined in accordance with the kind and amount of gas, an abatement part optimized for various gas conditions can be designed quickly and provided.
6) Even if one of abatement parts which are connected in parallel breaks down, another abatement part can perform exhaust gas treatment, thereby preventing shutdown of a process.
7) Since the vacuum pump with abatement function has a display capable of collectively displaying statuses of the dry vacuum pump and the abatement part, a communication port capable of collectively monitoring and/or operating the statuses, and a contact input/output port, connection points are reduced, and thus the operability is improved and the time required for setting up an apparatus can be shortened.
8) In the case where the vacuum pump is used in a process in which the abatement part is not used or in the case where exhaust gas treatment is not necessary, the abatement part can be bypassed and the operation of the abatement part can be stopped. Thus, the vacuum pump has excellent energy-saving characteristics. Further, the operation status of the abatement part can be changed (stop of operation or change of operation intensity of the abatement part) depending on the amount of gas to be sucked into the dry vacuum pump, and thus the vacuum pump has excellent energy-saving characteristics.

9) Since excellent heat conductivity can be ensured between the booster vacuum pump and/or the main pump, and the abatement part, compression heat generated by operation of the pump is used for abatement treatment. Further, the pump is heated by heat generated in the abatement part. Further, compression heat generated in the main pump is transferred to the booster pump through the abatement part to heat the booster pump.

10) Since the dry vacuum pump, comprising the main pump and the booster pump, and the abatement part are integrated, a pipe and a heater for heating the pipe are not necessary, and thus the entire system can be provided at a low price.

11) Since the abatement part between the booster pump and the main pump produces heat by input energy for the exhaust gas treatment, the abatement part is not required to be heated. Therefore, a heater or a thermal insulator becomes unnecessary, and thus the entire system can be provided at a low price.

12) Since the heat of the main pump or the abatement part heats the booster pump, the booster pump becomes high temperature, and thus deposition of products in the booster pump can be avoided. Further, a heater or a thermal insulator for warming the booster pump becomes unnecessary, and thus the entire system can be provided at a low price.

13) Since the abatement part is enclosed by the enclosure, and the enclosure is connected to the exhaust duct of a facility where the vacuum pump is installed, a negative pressure is kept in the enclosure itself. Thus, even if a leakage occurs in the abatement part by any chance, a harmful gas can be prevented from flowing out.

14) A negative pressure is kept in the abatement part while the main pump is being operated. Thus, even if a leakage occurs in the abatement part by any chance, a harmful gas can be prevented from flowing out.

15) A gas temperature in the abatement part is high due to the compression heat of the main pump. Therefore, abatement treatment is performed at a high temperature to increase abatement efficiency.

16) Since the abatement part is in a vacuum state, which is a suitable environment for generating plasma, abatement treatment can be performed with a small amount of input energy.

DESCRIPTION OF EMBODIMENTS

Figure 1:
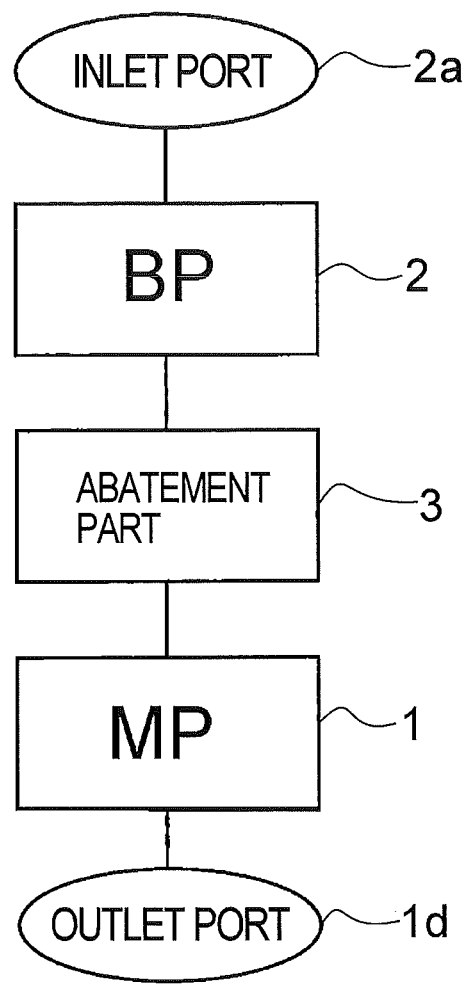
FIG. 1 is a schematic view showing a basic configuration of a vacuum pump with abatement function according to an embodiment.

A vacuum pump with abatement function according to embodiments will be described below with reference to FIGS. 1 through 11. In FIGS. 1 through 11, identical or corresponding parts are denoted by identical or corresponding reference numerals throughout views, and will not be described in duplication.

FIG. 1 is a schematic view showing a basic configuration of a vacuum pump with abatement function according to an embodiment.

As shown in FIG. 1, the vacuum pump with abatement function according to the embodiment comprises a main pump 1 capable of evacuating gas from an atmospheric pressure, a booster pump 2 for increasing an evacuation speed of the main pump 1, and an abatement part 3 connected between the main pump 1 and the booster pump 2. The main pump 1 serves as a pump for evacuating gas by compressing the gas through several stages from a vacuum to an atmospheric pressure, and comprises a multistage roots-type dry pump, a screw-type dry pump, or a claw-type dry pump. The booster pump 2 serves as a pump provided at the upstream side of the main pump 1 and configured to boost (increase) the evacuation speed of the main pump 1, and comprises a roots-type dry pump (singlestage or multistage), a screw-type dry pump, or a claw-type dry pump. The evacuation speed of the booster pump is generally in the range of about 5,000 l/min to 100,000 l/min. For example, if two booster pumps having an evacuation speed of 100,000 l/min are connected to each other, the displacement of 200,000 l/min can be obtained. Because the booster pump is generally used at a place where the degree of the vacuum is high (between vacuum range and the main pump), products are hard to be generated and it is unnecessary to cause a diluent gas to flow. Further, the booster pump needs less shaft seal gas than the main pump. An inlet port 2a of the booster pump 2 is connected to a process chamber of a manufacturing apparatus or the like for manufacturing semiconductor devices, liquid crystal panels, LEDs, or the like. A treated gas which has been treated to be made harmless by the abatement part 3 is exhausted through an outlet port 1d of the main pump 1.

In this manner, the vacuum pump with abatement function according to the embodiment comprises the dry vacuum pump, comprising the main pump 1 and the booster pump 2, to which the abatement part 3 for treating an exhaust gas to make the exhaust gas harmless is attached. According to the vacuum pump with abatement function of the embodiment, since the booster pump 2 is provided between the process chamber of the manufacturing apparatus and the abatement part 3, products generated by exhaust gas treatment do not flow back to the process chamber to contaminate the process chamber. Further, the amount of gas to be treated can be reduced because a purge gas and a diluent gas are not contained in the exhaust gas, and thus the amount of energy required for gas treatment in the abatement part 3 can be reduced to thereby achieve energy saving.

According to the embodiment, since the abatement part 3 is provided between the main pump 1 and the booster pump 2, the abatement part 3 is required to perform abatement treatment of the exhaust gas under vacuum. Therefore, treatment types of exhaust gas employed in the abatement part 3 include a plasma-type, a heater-type, a dry-type, and a catalytic-type.

In an embodiment, these plural kinds of the abatement parts employing different treatment types of exhaust gas are prepared. Further, a plurality of abatement parts having different treatment amounts of exhaust gas in each of the abatement parts employing different treatment types are prepared. Furthermore, a plurality of abatement parts having different treatment performances of exhaust gas in each of the abatement parts employing different treatment types are prepared. In an embodiment, an optimal abatement part 3 is selected, depending on the amount and kind of the exhaust gas discharged from the chamber, from the plural kinds of abatement parts employing different treatment types, and/or the plural abatement parts having different treatment amounts of exhaust gas, and/or the plural abatement parts having different treatment performances of exhaust gas, and the selected abatement part 3 is connected between the main pump 1 and the booster pump 2.

Next, configurations of the respective abatement parts having different treatment types will be described.

Figure 2:
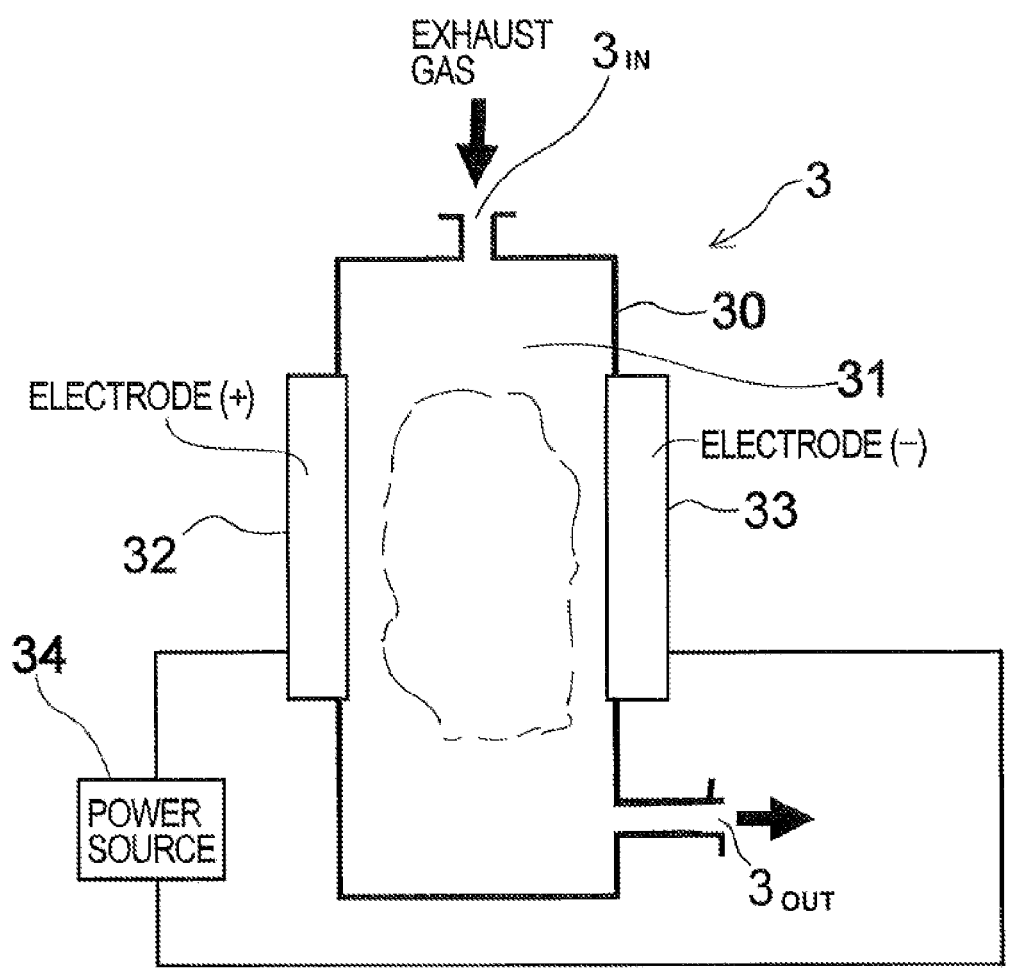
FIG. 2 is a schematic cross-sectional view showing a configuration of a plasma-type abatement part as the abatement part of a vacuum pump with abatement function.

FIG. 2 is a schematic cross-sectional view showing a configuration of a plasma-type abatement part 3 as the abatement part of a vacuum pump with abatement function. As shown in FIG. 2, the plasma-type abatement part 3 comprises a treatment chamber body 30 having a container shape. A treatment chamber 31 is formed in the treatment chamber body 30. In the treatment chamber 31, two electrodes (positive electrode and negative electrode) 32, 33 are disposed so as to face each other with a distance therebetween. A gas introduction port $3_{IN}$ for introducing the exhaust gas to be treated into the treatment chamber is formed at an upper part of the treatment chamber body 30, and a gas outlet $3_{OUT}$ for discharging the gas after treatment is formed at a lower part of the treatment chamber body 30.

As shown in FIG. 2, the exhaust gas discharged from the booster pump 2 is introduced into the treatment chamber 31 from the gas introduction port $3_{IN}$. A high voltage having a high frequency is applied between the two electrodes (positive electrode and negative electrode) 32, 33 by a power source 34 to generate plasma, thereby bombarding molecules of the exhaust gas with electrons, ions and the like at high speeds, so that the exhaust gas is decomposed and treated. The treated gas is discharged from the gas outlet $3_{OUT}$ and is sucked into the main pump 1. Since the plasma-type abatement part 3 shown in FIG. 2 is disposed between the booster pump 2 and the main pump 1, the abatement part 3 is in a vacuum state, which is a suitable environment for generating plasma, and thus abatement treatment can be performed with a small amount of input energy.

Figure 3:
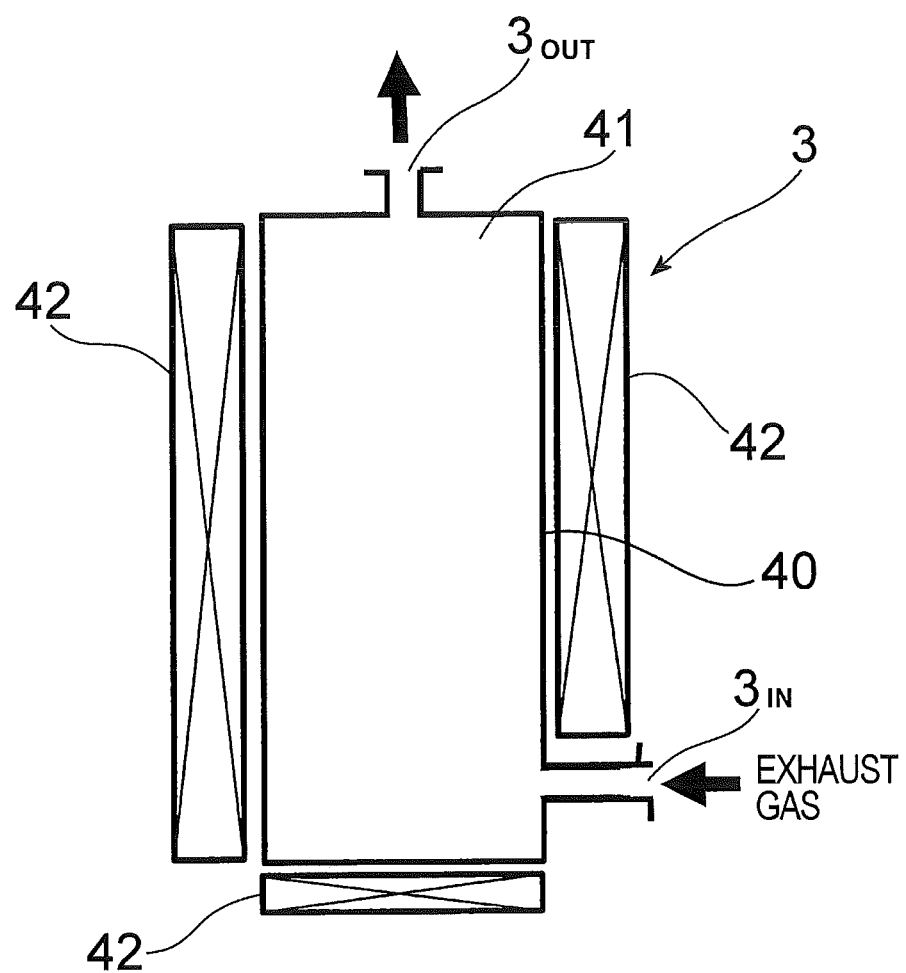
FIG. 3 is a schematic cross-sectional view showing a configuration of a heater-type abatement part as the abatement part of the vacuum pump with abatement function.

FIG. 3 is a schematic cross-sectional view showing a configuration of a heater-type abatement part 3 as the abatement part of the vacuum pump with abatement function. As shown in FIG. 3, the heater-type abatement part 3 comprises a treatment chamber body 40 having a container shape. A treatment chamber 41 is formed in the treatment chamber body 40. Heaters 42 are provided around the outer circumferential portion and at the outer bottom portion, of the treatment chamber body 40. A gas introduction port $3_{IN}$ for introducing the exhaust gas to be treated into the treatment chamber is formed at a lower part of the treatment chamber body 40, and a gas outlet $3_{OUT}$ for discharging the gas after treatment is formed at an upper part of the treatment chamber body 40.

As shown in FIG. 3, the exhaust gas discharged from the booster pump 2 is introduced into the treatment chamber 41 from the gas introduction port $3_{IN}$. The exhaust gas introduced into the treatment chamber 41 is heated by the heaters 42, and decomposed and treated at a high temperature of approximately 500° C. to 900° C., and the treated gas is discharged from the gas outlet $3_{OUT}$ and is sucked into the main pump 1.

Figure 4:
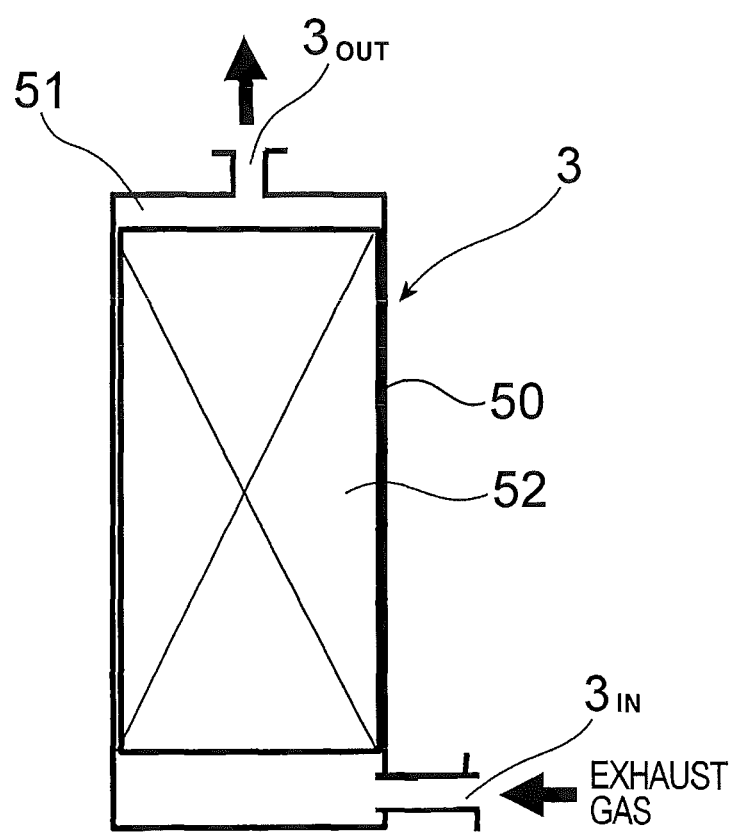
FIG. 4 is a schematic cross-sectional view showing a configuration of a dry-type abatement part as the abatement part of the vacuum pump with abatement function.

FIG. 4 is a schematic cross-sectional view showing a configuration of a dry-type abatement part 3 as the abatement part of the vacuum pump with abatement function. As shown in FIG. 4, the dry-type abatement part 3 comprises a treatment chamber body 50 having a container shape. A treatment chamber 51 is formed in the treatment chamber body 50. A gas introduction port $3_{IN}$ for introducing the exhaust gas to be treated into the treatment chamber is formed at a lower part of the treatment chamber body 50, and a gas outlet $3_{OUT}$ for discharging the gas after treatment is formed at an upper part of the treatment chamber body 50. The treatment chamber 51 is filled with treatment agent (chemical agent) 52 to adsorb the exhaust gas. The treatment agent comprises metal oxides, alkaline agents, noble metal catalysts, or the like. A heater may be provided at an outer wall of the treatment chamber 51 to heat the treatment agent (chemical agent).

As shown in FIG. 4, the exhaust gas discharged from the booster pump 2 is introduced into the treatment chamber 51 from the gas introduction port $3_{IN}$. Harmful components in the exhaust gas introduced into the treatment chamber 51 are adsorbed by the treatment agent 52 and treated, and the treated gas is discharged from the gas outlet $3_{OUT}$ and is sucked into the main pump 1.

Figure 5:
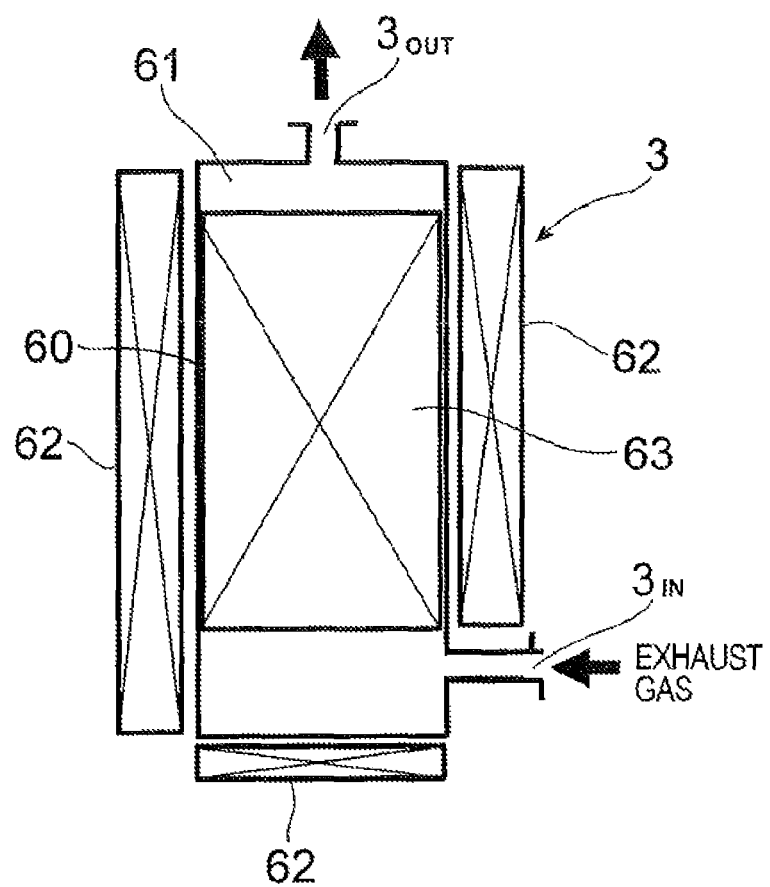
FIG. 5 is a schematic cross-sectional view showing a configuration of a fluorine-fixing-type abatement part, which is one of the catalytic-type abatement parts, as the abatement part of the vacuum pump with abatement function.

FIG. 5 is a schematic cross-sectional view showing a configuration of a fluorine-fixing-type abatement part 3, which is one of the catalytic-type abatement parts, as the abatement part of the vacuum pump with abatement function. As shown in FIG. 5, the fluorine-fixing-type abatement part 3 comprises a treatment chamber body 60 having a container shape. A treatment chamber 61 is formed in the treatment chamber body 60. Heaters 62 are provided around the outer circumferential portion and at the outer bottom portion, of the treatment chamber 61. A gas introduction port $3_{IN}$ for introducing the exhaust gas to be treated into the treatment chamber is formed at a lower part of the treatment chamber body 60, and a gas outlet $3_{OUT}$ for discharging the gas after treatment is formed at an upper part of the treatment chamber body 60.

The treatment chamber 61 is filled with fixing chemical agent 63 to fix F (fluorine) components. A mixed agent, which comprises metal components having high decomposition ability of the exhaust gas and metal components for fixing the decomposed F components, is used as the fixing chemical agent. F components contained in PFC gases and in by-product gas, such as $SiF_4$, generated from a process apparatus are fixed to the fixing chemical agent.

As shown in FIG. 5, the exhaust gas discharged from the booster pump 2 is introduced into the treatment chamber 61 from the gas introduction port $3_{IN}$. F components in the exhaust gas introduced into the treatment chamber 61 are fixed to the fixing chemical agent 63, and the treated gas is discharged from the gas outlet $3_{OUT}$ and is sucked into the main pump 1.

Figure 6A:
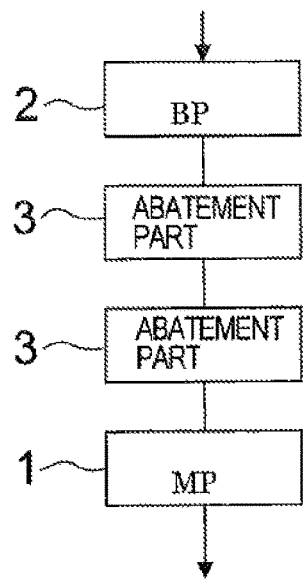
FIGS. 6A, 6B and 6C are schematic views showing examples wherein abatement parts connected between the main pump and the booster pump comprise a plurality of abatement parts arranged in series and/or in parallel.
Figure 6B:
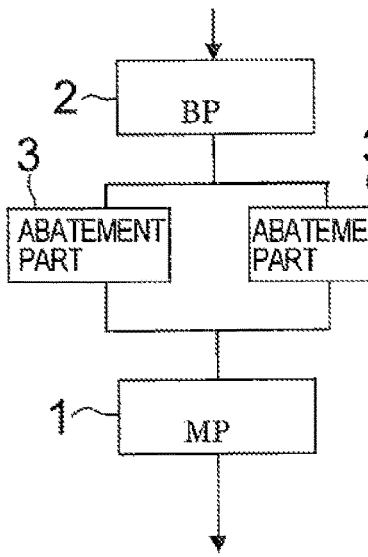
Figure 6C:
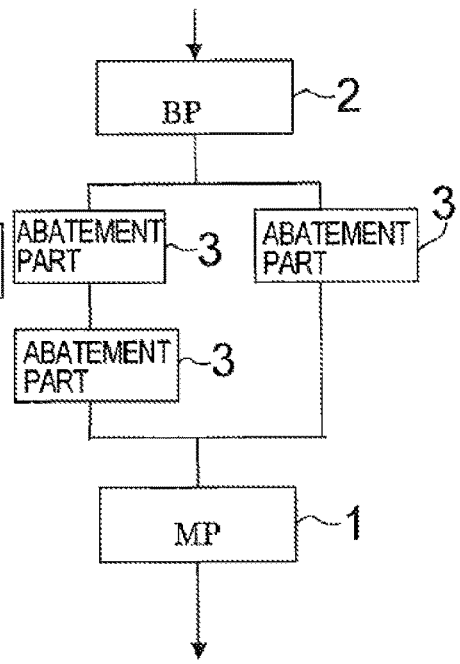

FIGS. 6A, 6B and 6C are schematic views showing examples wherein abatement parts 3 connected between the main pump 1 and the booster pump 2 comprise a plurality of abatement parts arranged in series and/or in parallel.

In the example shown in FIG. 6A, the plural (two as illustrated) abatement parts 3 are connected in series. The plural abatement parts 3 may be connected via a connecting pipe, or a gas outlet and a gas inlet of the two adjacent abatement parts 3 may be connected directly to each other without using the connecting pipe.

In the example shown in FIG. 6B, the plural (two as illustrated) abatement parts 3 are connected in parallel. The plural abatement parts 3 are connected in parallel via connecting pipes.

In the example shown in FIG. 6C, the plural abatement parts 3 are connected in series and in parallel via connecting pipes. Specifically, the plural (two as illustrated) abatement parts 3 are connected in parallel via connecting pipes, and an abatement part 3 is arranged in one of the connecting pipes so as to form two-stage abatement parts in series.

As shown in FIGS. 6A, 6B and 6C, the plural abatement parts 3 are arranged in series and/or in parallel to form a group of abatement parts which can cope with various kinds of process demands and complex process demands. The plural abatement parts 3 may be connected in combination of the plural kinds of the abatement parts 3 such as a plasma-type abatement part, a dry-type abatement part, a catalytic-type abatement part, and a heater-type abatement part, or in combination of the plural abatement parts 3 of a single kind, depending on the amount and kinds of the exhaust gas.

As shown in FIGS. 6B and 6C, by arranging the abatement parts 3 in parallel, back-up operation can easily be performed. Specifically, at the time of breakdown or maintenance of one abatement part 3, another abatement part 3 can perform the back-up operation to make the process downtime zero.

Since the abatement part is small in size and inexpensive, by installing a plurality of abatement parts for a single process chamber, the back-up function can be provided in a simple way at a low cost. The back-up function may be provided by connecting the same type of abatement parts in parallel, or by connecting the different types of abatement parts in parallel.

Since the abatement part does not require to be installed fixedly on a base or a floor, the abatement part can be easily replaced with a normal product. If replacement of the abatement part is needed, a line is bypassed to the back-up abatement part, and the abatement part to be replaced is removed by means of a clamp coupling or the like. Thus, the abatement part can be replaced without shutdown of the process operation. Therefore, an interruption of the process operation for the maintenance of the abatement part can be avoided.

The design of the abatement part 3 itself is unnecessary or minimized, and only the layout consideration is sufficient. Further, since the abatement parts 3 are standardized for each level of required performance, modification parts can be manufactured easily. Furthermore, the delivery time for the parts can be reduced and the modification procedure can be simplified.

Since every abatement part is designed to meet the standards, in the case of new required specifications, the consideration and acquisition of certification for the standards is not necessary. If necessary, a valve may be provided in the connecting pipe. In the case where the plural abatement parts 3 are connected in series and/or in parallel, the installation place and direction of the abatement parts 3 can be set freely.

Conventionally, in the case of the dry-type abatement apparatuses, filler compositions of chemical agents for the dry-type columns have been changed depending on respective processes. Therefore, in order to achieve the optimization of exhaust gas treatment, a large variety of dry-type columns have needed to be prepared. In addition, the changes of filler compositions have needed to bring back the dry-type columns to the factory each time, and to replace the chemical agents therein.

On the other hand, as shown in FIGS. 6A, 6B and 6C, by arranging the plural abatement parts 3 in series and/or in parallel, the preceding and/or subsequent abatement parts of the plural abatement parts can be easily replaced with an abatement part (parts) filled with other kind (kinds) of chemical agent, and thus the optimization of exhaust gas treatment to exhaust gases generated from different processes can be achieved.

Further, by replacing the abatement part on site, the compositions of the chemical agent can be changed quickly. By changing the kind of chemical agent, a noble gas may be purified and recycled. Further, Pd catalyst is used for $H_2$ treatment to generate heat, which can be reused, for example, to heat $N_2$ gas for the vacuum pump.

Conventionally, in the case of the heater-type abatement apparatuses, abatement apparatuses having different heater capacities with respect to respective gas flow rates to be introduced have needed to be prepared.

On the other hand, since the plural abatement parts 3 are arranged in series and/or in parallel as shown in FIGS. 6A, 6B and 6C, if plural kinds of heater-type abatement parts having respectively different heater capacities are prepared and arranged depending on a gas flow rate to be introduced, in series, in parallel or in combination thereof, the abatement part does not need to be designed to have excessive heater capacity, but the optimal abatement part which fits with the gas flow rate to be introduced can be provided at a low cost.

Further, by providing the catalytic-type abatement part at a downstream side of the heater-type abatement part, treatment of PFC gases and fluorine-fixing can be performed. Furthermore, heat generated in the heater-type abatement part can be reused, for example, to heat $N_2$ gas for the vacuum pump.

Figure 7:
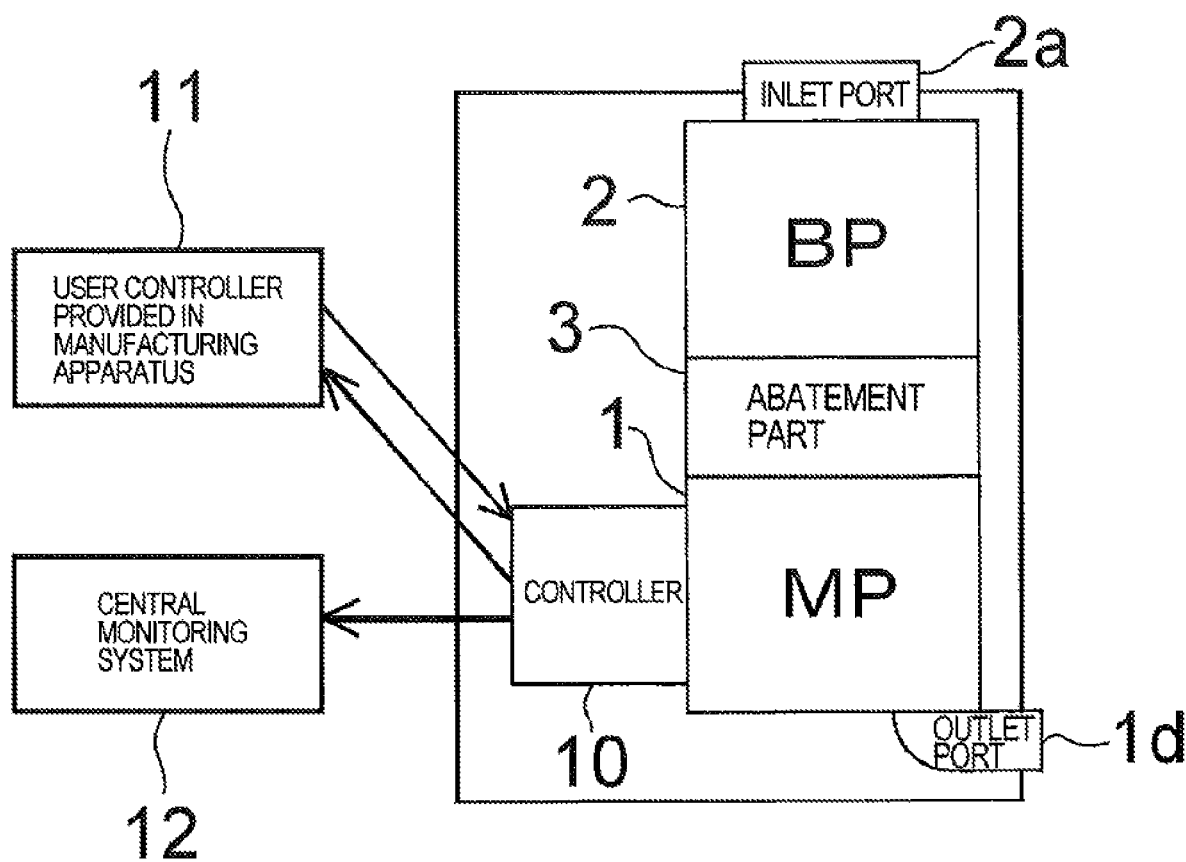
FIG. 7 is a schematic view showing an overall arrangement configuration of the vacuum pump with abatement function.

FIG. 7 is a schematic view showing an overall arrangement configuration of the vacuum pump with abatement function. As shown in FIG. 7, the main pump 1 and the abatement part 3 are arranged in contact with each other, and the booster pump 2 and the abatement part 3 are arranged in contact with each other. Here, "in contact with each other" means that a casing of the main pump 1 and a casing of the abatement part 3 are in contact with each other, and a casing of the booster pump 2 and a casing of the abatement part 3 are in contact with each other. In this case, a medium having high thermal conductivity such as silicone grease may be applied to a contact surface. Alternatively, a boundary part between the main pump 1 and the abatement part 3 may be constructed of a single common wall and a boundary part between the booster pump 2 and the abatement part 3 may be constructed of a single common wall to thereby integrate the main pump 1, the booster pump 2 and the abatement part 3.

As shown in FIG. 7, according to the embodiment, the main pump 1 and/or the booster pump 2, and the abatement part 3 are in contact with each other, or are integrated. Therefore, the following advantages can be obtained.

1) Since excellent heat conductivity can be ensured between the booster pump 2 and/or the main pump 1, and the abatement part 3, compression heat generated by operation of the pump is used for abatement treatment. Further, the pump is heated by heat generated in the abatement part 3. Furthermore, compression heat generated in the main pump 1 is transferred to the booster pump 2 through the abatement part 3 to heat the booster pump 2.

2) Since the dry vacuum pump, comprising the main pump 1 and the booster pump 2, and the abatement part 3 are integrated, a pipe and a heater for heating the pipe are not necessary, and thus the entire system can be provided at a low price.

3) Since the abatement part 3 between the booster pump 2 and the main pump 1 produces heat by input energy for the exhaust gas treatment, the abatement part 3 is not required to be heated. Therefore, a heater or a thermal insulator becomes unnecessary, and thus the entire system can be provided at a low price.

4) Since the heat of the main pump 1 or the abatement part 3 heats the booster pump 2, the booster pump 2 becomes high temperature, and thus deposition of products in the booster pump 2 can be avoided. Further, a heater or a thermal insulator for warming the booster pump 2 becomes unnecessary, and thus the entire system can be provided at a low price.

Further, as shown in FIG. 7, a controller 10 is attached to the dry vacuum pump comprising the main pump 1 and the booster pump 2. Although the configuration in which the controller 10 is attached to the main pump 1 is shown in the illustrated example, the controller 10 may be provided in a vacuum pump apparatus including the main pump 1, the booster pump 2, and the abatement part 3. The controller 10 is configured to collectively control the vacuum pump, comprising the main pump 1 and the booster pump 2, and the abatement part 3 so that a portion of signal input/output of the pump is connected to the abatement part 3, and operation control and status monitoring of the abatement part 3 are performed by the controller 10. Specifically, the controller 10 is configured to output operation/shutdown signals to the abatement part 3, and the abatement part 3 is configured to output the status signals of the abatement part 3 to the controller 10. The controller 10 is capable of sending and receiving signals, via communication lines and the like, to and from a user controller 11 provided in a manufacturing apparatus or the like. Further, the controller 10 outputs status signals of the main pump 1, the booster pump 2 and the abatement part 3 to a central monitoring system 12.

When operation signals of the main pump 1 and the booster pump 2 are outputted from the controller 10, an operation signal of the abatement part 3 is outputted simultaneously from the controller 10 to the abatement part 3, thereby starting the operation of the abatement part 3. While the dry vacuum pump 1 is in idling operation, the operation of the abatement part 3 is stopped. In the controller 10, setting of operational timing of the abatement part 3 can be changed. The pump can be operated by a remote operation, local operation and COM operation. Since a main breaker is provided in the controller 10, only the minimum necessary electric components are sufficient for the abatement part 3.

Since the controller 10 is configured to collectively control the vacuum pump, comprising the main pump 1 and the booster pump 2, and the abatement part 3, it is not necessary to prepare interfaces from the manufacturing apparatus respectively for the vacuum pump and for the exhaust gas treatment apparatus unlike conventional manner. Further, the abatement part 3 is comprised of the minimum necessary electric components. Furthermore, since a main port for signals is provided in the vacuum pump, the control of the apparatus side or the factory side can be simplified.

Since the controller 10 controls the abatement part 3 in accordance with the operation status of the vacuum pump comprising the main pump 1 and the booster pump 2, synchronous operation and safe operation, in accordance with the use conditions and use environment, of the abatement part and the vacuum pump can be realized. The operation mode of the abatement part 3 can be optimized in accordance with the use status of the vacuum pump.

Since the status of the abatement part 3 is displayed on a status monitoring device of the vacuum pump comprising the main pump 1 and the booster pump 2, the operation can be performed easily. The collective control can be performed based on only the status displayed on a master vacuum pump, and abnormalities of the abatement part and the pump can be collectively monitored by the user.

Further, since the consolidated information of the vacuum pump, comprising the main pump 1 and the booster pump 2, and the abatement part 3 can be collected, the status of the vacuum pump and the abatement part 3 at the time of trouble can be grasped, and thus the trouble can be analyzed easily and the time necessary for coping with the trouble and the improvement can be shortened.

Although FIG. 7 shows a single abatement part 3 connected between the main pump 1 and the booster pump 2, the abatement part 3 connected between the main pump 1 and the booster pump 2 may comprise a plurality of abatement parts 3 arranged in series and/or in parallel as shown in FIGS. 6A, 6B and 6C. In such a case, the plural abatement parts 3 and the controller 10 are connected, and thus the controller 10 can recognize the kinds and the number of the abatement parts 3 automatically. The controller 10 may select the kinds and the number of the abatement parts 3 individually.

Figure 8:
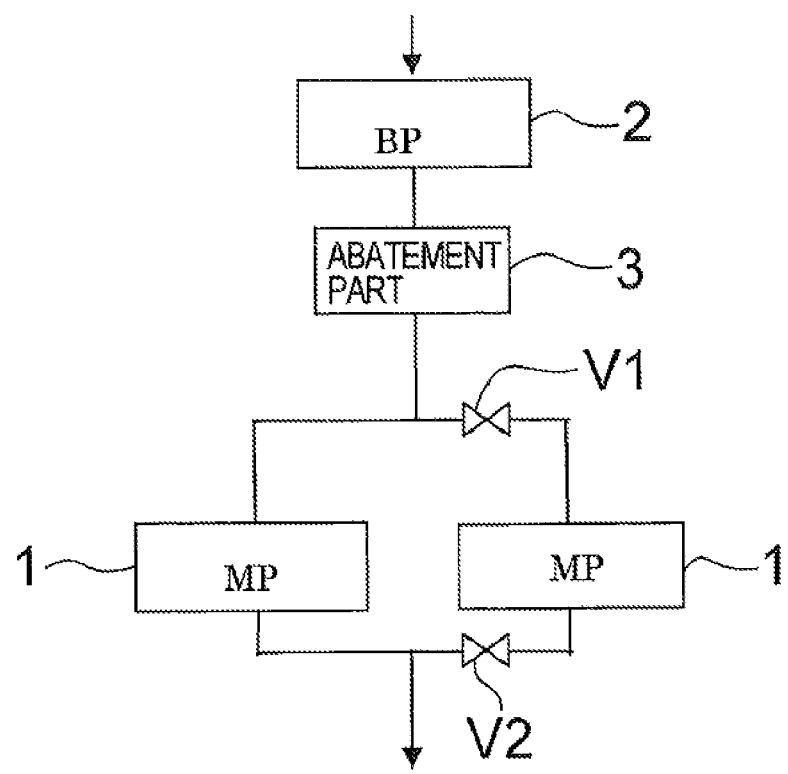
FIG. 8 is a schematic view showing a configuration in which the vacuum pump comprises a plurality of main pumps.

FIG. 8 is a schematic view showing a configuration in which the vacuum pump comprises a plurality of main pumps. As shown in FIG. 8, the plural main pumps 1 are connected in parallel to the abatement part 3. The plural main pumps 1 are operated in parallel. Although a single main pump 1 has evacuation performance capable of evacuating a chamber of the manufacturing apparatus, the evacuation time can be shortened by operating two main pumps in parallel. Further, even when one main pump 1 is stopped due to breakdown or the like, the other main pump 1 can continue to operate without any hindrance to a manufacturing process. Further, since valves V1 and V2 are provided in the connecting pipes, maintenance or replacement of the main pump 1 which has been stopped due to breakdown or the like can be performed while the manufacturing process is continued by operating the single main pump 1. The valves V1 and V2 may be omitted.

Figure 9A:
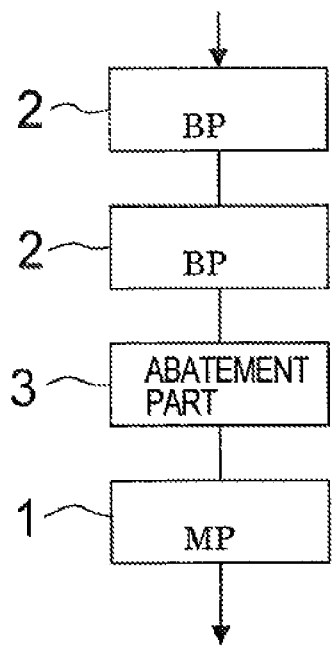
FIGS. 9A and 9B are schematic views showing examples wherein the booster pump comprises a plurality of pumps connected in series and/or in parallel.
Figure 9B:
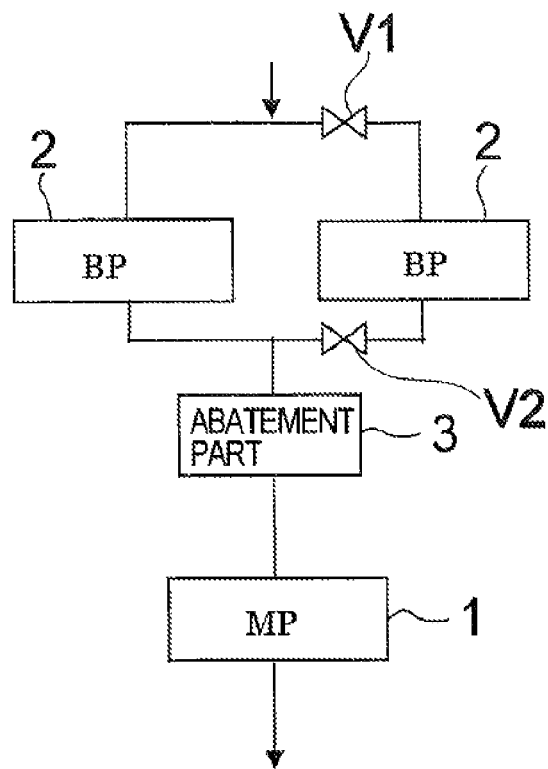

FIGS. 9A and 9B are schematic views showing examples wherein the booster pumps 2 are connected in series and in parallel, respectively.

In the example shown in FIG. 9A, the plural (two as illustrated) booster pumps 2 are connected in series. The plural booster pumps 2 may be connected via a connecting pipe, or an outlet port and an inlet port of the two adjacent booster pumps 2 may be connected directly to each other without using the connecting pipe.

In the example shown in FIG. 9B, the plural (two as illustrated) booster pumps 2 are connected in parallel. The plural booster pumps 2 are connected in parallel via connecting pipes.

As shown in FIGS. 9A and 9B, since the plural booster pumps 2 are arranged in series and/or in parallel, the evacuation speed of the main pump 1 can be increased and the flow rate of the gas capable of being evacuated can be increased, compared to the case where a single booster pump is provided.

As shown in FIG. 9B, in the case where the plural (two as illustrated) booster pumps 2 are connected in parallel, the plural booster pumps 2 are operated in parallel. Although the single booster pump 2 has a performance for increasing the evacuation speed of the main pump 1 sufficiently, the evacuation speed of the two booster pumps 2 operated in parallel can be two times that of the single booster pump 2. Further, even when one booster pump 2 is stopped due to breakdown or the like, the other booster pump 2 can continue to operate without any hindrance to a manufacturing process. Furthermore, because the valves V1 and V2 are provided in the connecting pipes, while the manufacturing process is continued by operating one booster pump 2, maintenance or replacement of the booster pump 2 which has been stopped due to breakdown or the like can be performed. The valves V1 and V2 may be omitted.

Figure 10:
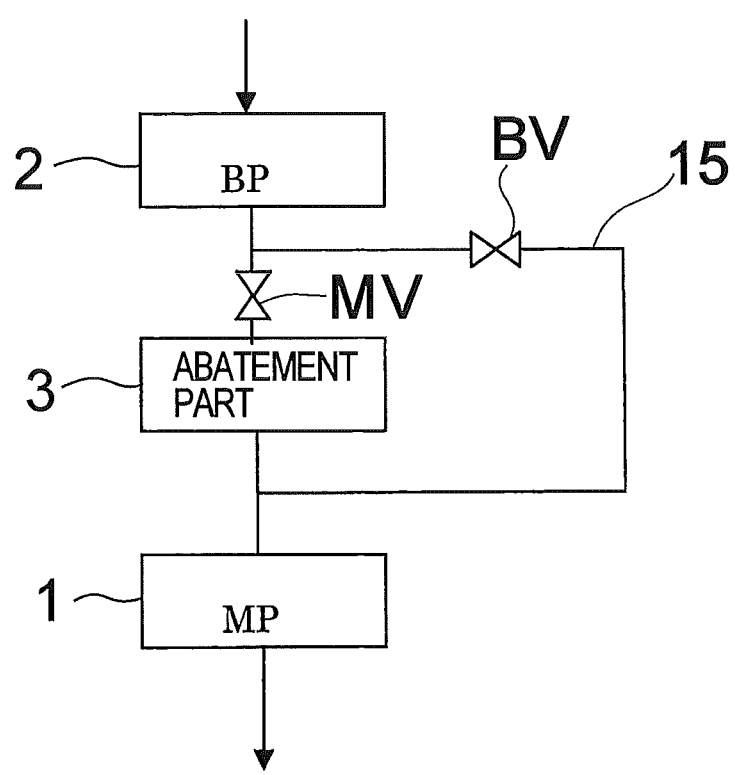
FIG. 10 is a schematic view showing a configuration which has a bypass passage for bypassing the abatement part which connects the main pump and the booster pump.

FIG. 10 is a schematic view showing a configuration which has a bypass passage for bypassing the abatement part 3 which connects the main pump 1 and the booster pump 2. As shown in FIG. 10, a bypass passage 15 is provided by allowing a flow passage interconnecting the booster pump 2 and the abatement part 3 to branch, and the downstream end of the bypass passage 15 is connected to the flow passage interconnecting the abatement part 3 and the main pump 1. A main valve MV is provided in the flow passage interconnecting the booster pump 2 and the abatement part 3, and a bypass valve BV is provided in the bypass passage 15.

According to the configuration shown in FIG. 10, when treatment for making the exhaust gas harmless is not necessary, the main valve MV is closed and the bypass valve BV is opened. Thus, the abatement part 3 is bypassed and the operation of the abatement part 3 is stopped to allow only pump function to be used. Therefore, energy saving can be achieved.

Next, a control method in the case where the operation status of the abatement part 3 is changed during the operation of the dry vacuum pump will be described.

The dry vacuum pump is driven by controlling a motor with an inverter. The inverter controls the motor at a rated rotational speed. An output power of the inverter is automatically controlled base on a motor load. Specifically, when the motor load increases, the output power of the inverter is automatically increased to keep an operational rotational speed. On the other hand, as a characteristic of the dry vacuum pump, as the gas flow rate to be sucked increases, the motor load is increased. Although the relationship between the amount of gas and the motor load differs depending on structures of pumps, the motor load varies in accordance with the amount of gas to be sucked in any event.

If the relationship between the amount of gas to be sucked, the motor load, and the output power of the inverter is clarified in advance, the amount of gas to be sucked can be estimated from the output power of the inverter. Since the abatement function is not necessary when gas is not sucked, it is estimated whether or not gas flows, and when the gas does not flow, the operation of the abatement part is automatically stopped. Thus, energy saving can be achieved.

Next, a specific control method will be described. The output power of the inverter used for driving the booster pump 2 is monitored, and when the output power exceeds a threshold A or becomes lower than the threshold A, the operation of the abatement part 3 is stopped. When the output power becomes lower than a threshold B or exceeds the threshold B, the operation of the abatement part 3 is restarted. When the operation of the abatement part 3 is stopped, in FIG. 10, the main valve MV is closed and the bypass valve BV is opened to allow the gas to flow through the bypass passage IS.

Although ON/OFF control of the abatement part 3 is performed in the above control method, the abatement part 3 can be controlled so as to change operation intensity. Specifically, multilevel settings (e.g., high, medium, low) for the operation intensity of the abatement part are established in accordance with the amount of gas to be sucked which is estimated from the output power of the inverter used for driving the booster pump 2, and when the amount of gas to be sucked is small according to the monitored output power of the inverter, the abatement part 3 is operated at low intensity, thereby achieving energy saving.

Although the amount of gas to be sucked is estimated from the output power of the inverter used for driving the booster pump 2 in the above embodiment, the amount of gas to be sucked may be estimated from the following methods.
1) The amount of gas to be sucked is estimated from the output power of the inverter used for driving the main pump 1. In the case where the amount of gas to be sucked is estimated either one of the main pump 1 and the booster pump 2, there is no difference in their response speeds. However, because it is considered that estimation of the amount of gas is easier in the pump whose change of the output power depending on the amount of gas appears prominently than in the other pump, the pump whose change of the output power appears prominently is selected for the estimation of the amount of gas.
2) The amount of gas to be sucked is estimated from both of the output power of the inverter used for driving the booster pump 2 and the output power of the inverter used for driving the main pump 1. In this case, taking into consideration the possibility that the pump whose estimated amount of gas to be sucked is larger between the main pump 1 and the booster pump 2 has a large load due to factors such as products except for the amount of gas, the abatement part is controlled according to the pump whose estimated amount of gas to be sucked is smaller, thereby enhancing energy conservation.

Figure 11:
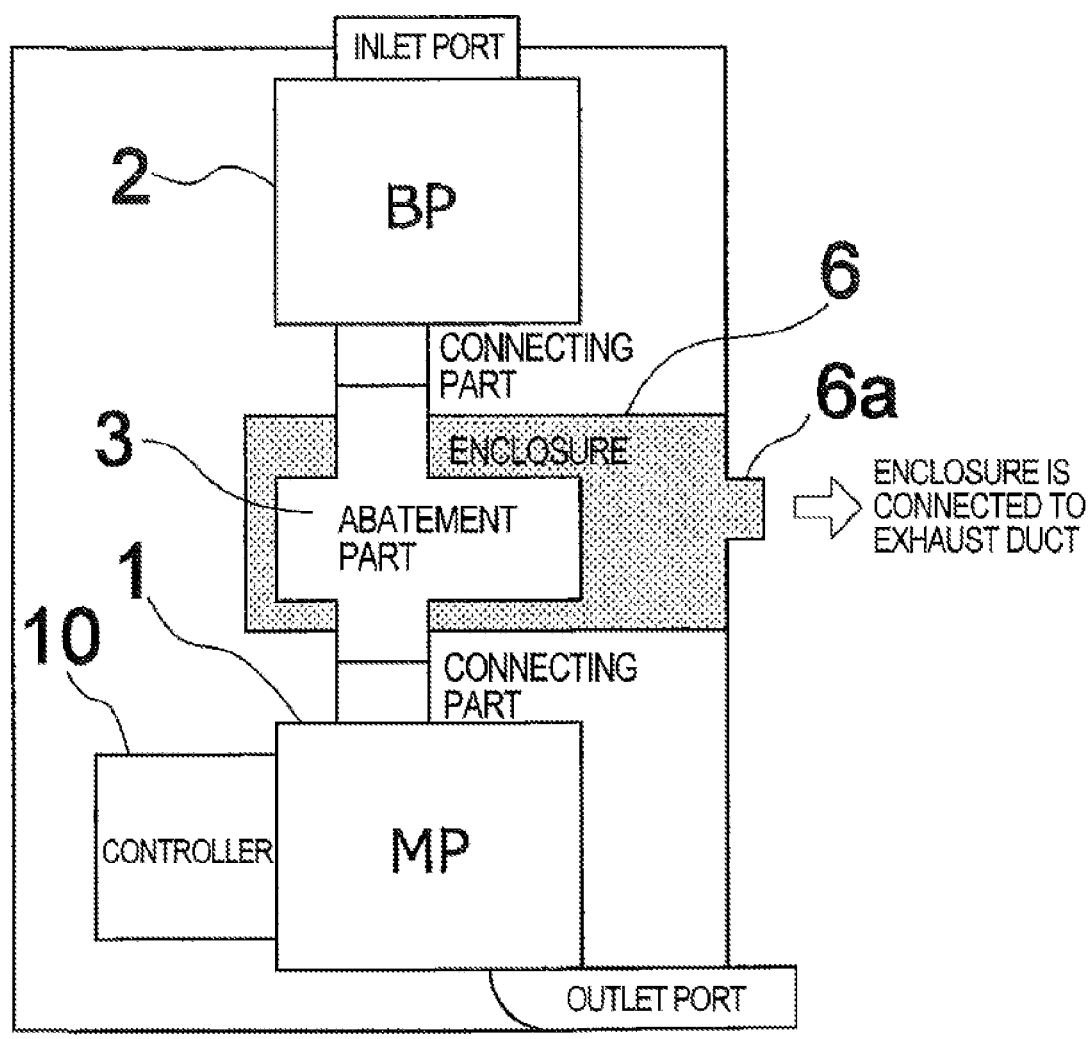
FIG. 11 is a schematic view showing a configuration having an enclosure which houses the abatement part.

FIG. 11 is a schematic view showing a configuration having an enclosure which houses the abatement part 3. As shown in FIG. 11, the booster pump 2 and the abatement part 3 are connected via a connecting part, and the abatement part 3 and the main pump 1 are connected via a connecting part. The abatement part 3 is housed by an enclosure 6. The enclosure 6 is an airtight structure and has an exhaust part 6a for connecting the enclosure 6 to an exhaust duct. As shown in FIG. 11, since the abatement part 3 is enclosed by the enclosure 6 and the enclosure 6 is connected to the exhaust duct of a facility where the vacuum pump is installed, a negative pressure is kept in the enclosure itself. Thus, even if a leakage occurs in the abatement part 3 by any chance, a harmful gas can be prevented from flowing out to the outside.

Although the embodiments of the present invention have been described above, it should be understood that the present invention is not limited to the above embodiments, but various changes and modifications may be made to the embodiments without departing from the scope of the appended claims.

What is claimed is:

1. A vacuum pump with abatement function comprising:
   a dry vacuum pump having a main pump comprising an outlet port and being capable of evacuating an exhaust gas to an atmospheric pressure and a booster pump comprising an inlet port and being capable of increasing an evacuation speed of the main pump, wherein the main pump comprises a multistage roots-type dry pump and the booster pump comprises a singlestage or multistage roots-type dry pump; and
   at least one abatement part being capable of treating the exhaust gas, the at least one abatement part being positioned between the main pump and the booster pump, wherein a flow path is formed between the inlet port and the outlet port, and wherein the main pump, the abatement part and the booster pump are integrated by allowing a first boundary part between the main pump and the abatement part to be constructed of a first single common wall and allowing a second boundary part between the booster pump and the abatement part to be constructed of a second single common wall, whereby heat conductivity is ensured between the main pump and the abatement part through the first single common wall or between the booster pump and the abatement part through the second single common wall;
   wherein the abatement part between the main pump and the booster pump produces heat by input energy for treating the exhaust gas and the heat produced in the abatement part heats the booster pump by said heat conductivity, and compression heat generated in the main pump is transferred to the booster pump through the abatement part by said heat conductivity to heat the booster pump.

2. The vacuum pump with abatement function according to claim 1, wherein the at least one abatement part comprises a plasma-type abatement part, a dry-type abatement part, a catalytic-type abatement part, or a heater-type abatement part.

3. The vacuum pump with abatement function according to claim 1, wherein the vacuum pump with abatement function comprises a single main pump or a plurality of main pumps connected in parallel.

4. The vacuum pump with abatement function according to claim 1, wherein the vacuum pump with abatement function comprises a single booster pump or a plurality of booster pumps connected in series and/or in parallel.

5. The vacuum pump with abatement function according to claim 1, wherein the vacuum pump with abatement function comprises an enclosure configured to house the at least one abatement part, and an exhaust part configured to connect the enclosure to an exhaust duct.

6. The vacuum pump with abatement function according to claim 1, further comprising a controller attached to the dry vacuum pump and configured to collectively control the dry vacuum pump and the at least one abatement part;
   wherein the controller attached to the dry vacuum pump monitors an output power of an inverter used for driving the booster pump and changes an operational state of the at least one abatement part based on a value of the output power of the inverter.

7. The vacuum pump with abatement function according to claim 1, wherein the at least one abatement part connected between the main pump and the booster pump comprises a plurality of abatement parts which are arranged in series and/or in parallel.

8. The vacuum pump with abatement function according to claim 7, wherein the plurality of the abatement parts are arranged in parallel to have back-up function of one or more abatement parts in the plurality.

9. The vacuum pump with abatement function according to claim 7, wherein the plurality of abatement parts comprise abatement parts having different treatment types of exhaust gas and/or different treatment amounts of exhaust gas and/or different treatment performances of exhaust gas.